United States Patent [19]
Silliman et al.

[11] Patent Number: 5,857,860
[45] Date of Patent: Jan. 12, 1999

[54] SWITCHABLE OR AUTOMATICALLY TERMINATING CONNECTING DEVICE AND COMBINATION THEREOF

[75] Inventors: Michael Thomas Silliman, Deansboro; George E. Soltysik, Jamesville, both of N.Y.

[73] Assignee: Philips Electronics North America Corporation, New York, N.Y.

[21] Appl. No.: 774,765

[22] Filed: Dec. 30, 1996

[51] Int. Cl.$^6$ .................................................. H01R 29/00
[52] U.S. Cl. .......................................... 439/171; 439/944
[58] Field of Search ......................... 439/188, 170–172, 439/166, 944, 578, 579, 581, 52; 333/101, 103, 105, 106

[56] References Cited

U.S. PATENT DOCUMENTS

| | | | |
|---|---|---|---|
| 792,377 | 6/1905 | Young | 285/343 |
| 2,497,273 | 2/1950 | Richardson | 285/342 |
| 2,693,377 | 11/1954 | Wurzburger | 285/343 |
| 3,266,824 | 8/1966 | Neally | 285/342 |
| 3,591,208 | 7/1971 | Nicolaus | 285/343 |
| 3,784,950 | 1/1974 | Coffman | 338/220 |
| 3,895,318 | 7/1975 | Ross | 333/6 |
| 4,127,290 | 11/1978 | Mutschlechner | 285/343 |
| 4,169,967 | 10/1979 | Bachle | 285/343 |
| 4,553,806 | 11/1985 | Forney, Jr. et al. | 339/94 C |
| 4,577,221 | 3/1986 | Skinner, Sr. et al. | 358/86 |
| 4,713,024 | 12/1987 | Hatakeyama et al. | 439/555 |
| 4,755,152 | 7/1988 | Elliot et al. | 439/452 |
| 4,887,979 | 12/1989 | Jacobs | 439/578 |
| 4,897,050 | 1/1990 | Randolph | 439/585 |
| 4,963,966 | 10/1990 | Harney et al. | 358/349 |
| 4,990,106 | 2/1991 | Szegda | 439/585 |
| 5,038,005 | 8/1991 | Hohorst et al. | 439/171 |
| 5,051,541 | 9/1991 | Bawa et al. | 285/343 |
| 5,073,129 | 12/1991 | Szegda | 439/585 |
| 5,083,943 | 1/1992 | Tarrant | 439/583 |
| 5,217,393 | 6/1993 | Del Negro et al. | 439/585 |
| 5,505,636 | 4/1996 | Blum | 439/579 |
| 5,632,637 | 5/1997 | Diener | 439/188 |
| 5,669,779 | 9/1997 | Galloway et al. | 439/188 |

FOREIGN PATENT DOCUMENTS

| | | | |
|---|---|---|---|
| 0776071A2 | 5/1997 | European Pat. Off. | H01R 17/12 |
| 0786832A1 | 7/1997 | European Pat. Off. | H01R 17/04 |
| 1199558 | 8/1965 | Germany | 285/343 |
| 96/10852 | 4/1996 | WIPO | H01R 17/12 |
| 96/10853 | 4/1996 | WIPO | H01R 17/12 |
| 97/07571 | 2/1997 | WIPO | H01R 17/04 |

*Primary Examiner*—Neil Abrams
*Assistant Examiner*—Brian J. Biggi
*Attorney, Agent, or Firm*—Ernestine C. Bartlett

[57] ABSTRACT

An electrical connector for automatically terminating signals in distribution equipment is provided, particularly in the form of a tap housing containing the F-port connector installed in a CATV system. The connector includes a cylindrical outer conductor for attachment to a housing of the distribution equipment which contains a pcb, a conductor of a coaxial cable being connectable to said outer conductor; an inner resilient conductor member contained in the outer conductor and connectable to an electrical circuit when contacting the pcb, a conductor of a coaxial cable being connectable to the inner resilient conductor member; and signal terminating means comprising a resistor operatively associated with the resilient conductor member and the pcb whereby an electrical circuit may be selectively opened and closed to automatically terminate the signals when the inner resilient conductor member has contact with the pcb.

16 Claims, 6 Drawing Sheets

SWITCHABLE OR AUTOMATICALLY TERMINATING CONNECTING DEVICE AND COMBINATION THEREOF

FIELD OF THE INVENTION

This invention relates to electrical connecting devices, more particularly to connectors used to connect cables to connector ports or terminals on electrical distribution equipment and especially to connectors used in taps for connecting coaxial cables in the cable television industry.

BACKGROUND OF THE INVENTION

The conventional coaxial cable usually consists of an electrically conducting center conductor, a first layer comprising a dielectric, a second layer comprising an electrically conducting sheath, a third layer comprising a braid, and a fourth layer comprising a jacket, or multiple layer combinations of either or both.

Currently, cable TV network systems use outdoor and indoor taps which are constructed as in FIG. 1. At least one input 11 and in most cases one output 12 are connected with the cable wire to transmit the signal to the next device. Networks on the inside of the taps including the printed circuit board (pcb) of tap units distribute and transmit the signal through F-port connector 13, then through cable wire to the end user. One such tap is disclosed and claimed in U.S. Pat. No. 4,887,979, commonly assigned herewith.

The conventional F-port connector 13 is generally tubular in configuration and may have a front end carrying an appropriate fastener designed to mate with equipment ports or terminals. Additionally, the conventional F-type connector or port comprises a standard female interface and includes a first hollow annular member having a generally cylindrical inner surface, end openings and a generally cylindrical outer surface extending for a portion of the axial length of the first annular hollow member.

Such connectors are used in the television industry, for example, on equipment for distributing signals to customers homes. Any signal not being used must be terminated without leakage. Normally, this is done with a separate external terminator connector.

Additionally, in the cable television industry, it is common to have many subscribers connected to the system via multiple connections. Electrical connecting devices are commonly used throughout the industry and it is not uncommon for any number of customers to be connected for differing and varying services delivered via a cable wire or wires. Problems arise when one or more customers opt for multiple service options such as cable television and/or telephone service through the same distribution system or when one or several customers wish to terminate service. These problems may be illustrated by considering, for example, the actions necessary in a neighborhood where via a tap housing as illustrated in FIG. 1, multiple customers are connected to the cable television system, when one customer wants to add telephone service through the cable system or another wishes to disconnect the system altogether, and/or another wishes to add the telephony and terminate the television service. With present technology, to accommodate these customers a field technician must go to the site to open the tap distribution unit and put an additional connection wire to add the telephony. It also requires a field technician to screw the unit apart and disconnect or remove the wire to discontinue telephony services; and to install a terminator connector for discontinued RF (TV) signals to the disconnected unit. If a terminator is not installed on all unused F-ports or connectors, the quality of the signal will be degraded and additional problems along with customer complaints will be generated. Additionally, in many cases the terminator is dropped or lost by the field technician and as a consequence is not installed and the unit is then left unterminated and the quality of the signal is degraded for the remaining customers.

Automatically terminating printed circuit board BNC connectors are known. Such pcbs are useful in input-output ports for network adapter cards, video matrix switches, video amplifiers, test equipment such as local oscillator and calibration outputs of signal analyzers, etc. one such known connector comprises a printed circuit board mounted BNC connector, terminating resistor, and moveable center conductor, and is advertised as containing a chip resistor which bridges the signal and ground paths when the connector is not mated to a BNC plug. This connector breaks the termination state by utilization of the center conductor of the mating. When the two connectors are attached to each other, the center pin from the mating part moves the center contact pin of the self-terminating connector opening the terminating circuitry. This arrangement is effective with BNC connectors because the center conductor of the mating part is a rigid pin. This arrangement is not effective with an "F" type connector because in "F" connectors, the center contact is the center conductor of the cable and it will bend or deflect or break during the contact necessary to move the pin to actuate the termination. There is thus a continued need in the art for self-terminating "F"-type connectors.

SUMMARY OF THE INVENTION

An object of this invention is to provide an electrical connector for distribution equipment that is easily switchable, for example (but not limited to) between RF (5 MHZ to 1 Ghz) and RF with power.

Another object of this invention is to provide an electrical connector for distribution equipment that automatically terminates unused signals in the equipment.

Another object of the invention is to provide such an automatic termination electrical connector and/or a switchable connector and/or combination thereof that is free of the disadvantages of the prior art indicated above and therefore provides an electrical connecting device that is substantially improved over known electrical connecting devices.

For ease of discussion and illustration, the invention will be described in terms of its application as an electrical connecting device containing a connector that is commonly referred to as an F-port connector. However, it will understood that the connecting device need not and should not be limited to use as an F-port connector and is suitable for connecting wires of different types of devices together where the ability to automatically terminate unused signals or current flow or to switch between various circuits to deliver various types of services is important.

The invention provides a means to automatically terminate the input of an electrical connecting device when a cable and mating connector is not installed without opening the tap or connector unit to provide access to the inside to make a change. This will allow a tap that is installed in a CATV system to supply power to customers requiring it and to automatically terminate the signal once the service is disconnected or discontinued without having to install a separate terminator on the unused F-ports. When a customer wishes to discontinue the service, the service provider needs only to actuate a pre-installed actuating mechanism present in the installed F-port connector.

The invention also provides a means to switch between two outputs, for example, between RF and RF with power from outside the unit, without opening the unit and without the need for extra internal parts, connectors, or devices, and without opening the tap or connector unit to provide access to the inside to make a change. This will allow a tap that is installed in a CATV system to supply RF with power to only customers requiring it for telephone service, for example, and to supply only RF for customers that subscribe to only cable television service. When a customer wishes to add telephone service, the installer only has to rotate the previously installed connector to turn on the power that will be required to operate the telephone to activate the additional service.

The invention provides means to switch between services and to automatically terminate the input of the electrical connector when a cable and mating connector is not installed without opening the tap or connector unit to provide access to the inside to make a change or to terminate the unused signals.

THE SWITCHABLE CONNECTOR

According to the invention, a construction is provided wherein a plunger or actuator pin in the connector and a capacitor cooperate so that when the connector is operating in one mode, the plunger or pin contacts the capacitor, the circuit is opened, and the signal flows. To switch the connector to a different mode, the connector is rotated, the capacitor blocks the first mode and operation in the second mode is established. The device comprises a tap housing which includes an F-port connector and the switching mechanism. The tap housing containing the F-port is installed in a CATV system to selectively supply RF with power to customers who subscribe to telephone service; and to provide only RF to customers who subscribe only to cable service such as cable television programs. It permits the service provider to install a single connector whenever it installs cable television services and to subsequently add telephone service from outside the location of the services by rotation of the connector to connect and turn on the power required to operate the telephone to provide telephone services.

In general, in accordance with the invention, there is provided, in its broadest sense, an electrical connector for making electrical connections between first electrical signal providing means and first electrical signal receiving means and alternatively between second electrical signal and power providing means and second electrical signal and power receiving means, and combinations thereof, said connector containing an inner resilient conductor member connectable to an electrical circuit when contacting circuit-providing means contained in the housing, such as a printed circuit board (pcb), switching means operatively associated with the inner resilient conductor member and the circuit-providing means for selectively opening or closing an electrical connection between either the said first means or the said second means and the said combinations thereof when the inner resilient conductor member contacts the circuit-providing means.

In preferred embodiments of the invention, the electrical connecting device is for use as an F-port in a cable television ("CATV") system which includes making electrical connections between first electrical signal providing means and first electrical signal receiving means to provide services including the provision of video and specifically, television, and alternatively between second electrical signal and power providing means and second electrical signal and power receiving means to provide services including telephone services, and combinations thereof, said connector containing the switching means comprising an inner resilient conductor member as descried above for selectively making or breaking the electrical connection between the said first means and a pcb and between the said second means and the pcb and combinations thereof.

In especially preferred embodiments of the invention, the electrical connecting device will include an F-port connector for use in CATV distribution equipment which includes means for making electrical connections between first RF electrical signal providing means and first RF electrical signal receiving means to provide CATV services, and alternatively between second RF electrical signal and power providing means and second RF electrical signal and power receiving means to provide telephone services, and combinations thereof, said connector containing an inner resilient conductor member connectable to an electrical circuit when contacting a pcb contained in the housing; switching means operatively associated with the inner resilient conductor member and the pcb for selectively opening or closing an electrical connection between either the said first means or the said second means and the said combinations thereof when the inner resilient conductor member contacts the pcb, wherein the inner resilient conductor member comprises:
an electropin formed at its inlet end with a first pair of push pieces between which the internal conductor of a coaxial cable is connectable and retainable, an actuator pin portion which extends from the first pair of push pieces to a second pair of push pieces and a third pair of push pieces, and a capacitor arranged between the second and third pair of push pieces; and wherein the switching means selectively switch the actuator pin to contact (a) the first and second pairs of push pieces, the capacitor and the pcb as a first mode; and (b) the first and third pairs of push pieces with the capacitor out of the circuit as the second mode or the connections and modes may be reversed.

The connecting device may also comprise a blocking capacitor mounted either inside the connector as described above or on a printed circuit board contained in the tap housing.

The connecting device may preferably comprise a tap housing which includes an F-port and any type of switching mechanism that will accomplish the desired purpose. It may include a first electrical half-connector or receptacle intended to provide signals and or power, and a second electrical half-connector or plug intended to receive power when mated with the receptacle and establishing connection between the components of the electrical circuit. The receptacle and plug assembly is preferably rotatable to switch between at least two inputs, and most preferably by separating, for example, by pulling, the outer or external half-connector and rotating it and subsequently again placing the half-connectors in mating position for example, by reinserting the external half-connector in mating relationship with the internal half-connector.

In other alternative embodiments, the connector may be of a single piece construction or the half-connectors may be two or more separate parts that separate or are caused to separate to effect switching between modes.

Switching may be accomplished by any means effective to make and break the circuit between the various modes such as, for example, a push/toggle device or a pin that pushes and moves an internal mechanism, The switch may be located inside the connector or on the pcb.

In another embodiment of the invention, the F-port is rotatable and comprises a first internal half-connector with a first RF socket position and a second RF with power socket position. An external half-connector with a male pin is mated in one of the socket positions. To switch between the two positions, the external half-connector is pulled from the assembly, rotated, and reassembled to mate in the desired socket position.

Alternatively, two or more wires connected by a switch and exiting the connector may be soldered to the pcb in the tap housing or in the connector; or the connector may have one wire which may exit the connector and be soldered to a pcb.

The blocking capacitor mounted inside the connector or on the pcb functions with the wires or pins in all of the embodiments to selectively make or break the selected circuit as desired.

AUTOMATICALLY TERMINATING CONNECTOR

The invention provides a means to automatically terminate the signal to the proper characteristic impedance when in the unmated state. The invention automatically terminates the input of an F-port connector when a cable and mating connector are not installed and thus eliminates the need to have a separate terminator available to install on unused F-ports.

According to the invention, termination of unused signals is accomplished automatically via a construction similar to that described above with respect to the SWITCHABLE CONNECTOR but wherein a plunger or actuator pin in the connector and a resistor which is spring loaded and making contact to ground and an RF line cooperate so that when the connector is screwed on or otherwise installed or connected to a mating connector, the plunger pushes the resistor, the circuit which is normally closed, is opened, and the signal flows. If the connector is unscrewed or otherwise removed or pulled out, the actuator pin moves out automatically terminating the signal.

Thus this part of the invention provides an automatically terminated electrical connector for making electrical connections between first electrical signal providing means and first electrical signal receiving means and/or alternatively between second electrical signal and power providing means and second electrical signal and power receiving means, and combinations thereof, said connector containing an inner resilient conductor member connectable to an electrical circuit when contacting circuit-providing means contained in the housing, such as a printed circuit board (pcb), means operatively associated with the inner resilient conductor member and the circuit-providing means for opening or closing an electrical connection between either the said first means or the said second means and the said combinations thereof when the inner resilient conductor member contacts the circuit-providing means, and means for terminating the signals when said inner resilient conductor member is not in contact with the circuit-providing means.

In preferred embodiments of the invention, the electrical connecting device is for use as an F-port in a cable television ("CATV") system which includes making electrical connections between first electrical signal providing means and first electrical signal receiving means to provide services including the provision of video and specifically, television, and alternatively between second electrical signal and power providing means and second electrical signal and power receiving means to provide services including telephone services, and combinations thereof, said connector containing an inner resilient conductor member connectable to an electrical circuit when contacting a pcb, means operatively associated with the inner resilient member and the the pcb for opening and closing the electrical connection between the said first means and a pcb and/or between the said second means and the pcb and combinations thereof when the inner resilient conductor member contacts the pcb, and means for terminating the signals when said inner resilient conductor member is not in contact with the pcb.

In especially preferred embodiments of the invention, the electrical connecting device will include an F-port connector for use in CATV distribution equipment which includes means for making electrical connections between first RF electrical signal providing means and first RF electrical signal receiving means to provide CATV services, and alternatively between second RF electrical signal and power providing means and second RF electrical signal and power receiving means to provide telephone services, and combinations thereof, said connector containing an inner resilient conductor member connectable to an electrical circuit when contacting a pcb contained in the housing; means operatively associated with the inner resilient conductor member and the pcb for selectively opening or closing an electrical connection between either the said first means or the said second means and the said combinations thereof when the inner resilient conductor member contacts the pcb, wherein the inner resilient conductor member comprises:
an electropin formed at its inlet end with a pair of push pieces between which the internal conductor of a coaxial cable is connectable and retainable, an actuator pin portion which extends from the pair of push pieces, and a resistor; and wherein the signals are automatically terminated when said actuator pin is not in contact with said resistor.

The connecting device may preferably comprise a tap housing which includes an F-port and any type of contact/non-contact mechanism that will accomplish the desired purpose.

The connector may be of a single piece construction or it may be two or more separate parts that separate or are caused to separate to terminate the contact between the actuator pin and the resistor.

Termination may be accomplished by any means effective to make and break the circuit such as, for example, a push/toggle device or a pin that pushes and moves an internal mechanism.

The resistor may be mounted inside the connector or on the pcb functions with the wires or pins in all of the embodiments to make or break the selected circuit as desired.

In an alternative embodiment, the resistor may be mounted on a pc board and adapted so that the pin makes or breaks the circuit when it touches the board, or the pin can contact a membrane switch on a pc board that is normally closed. When the F-port connector on the customer's cable is screwed onto the connector, the actuator pin contacts the the switch and opens it thus removing the termination. The switch or pin is preferably spring loaded via a spring contact assembly so that when the connector is removed, the pin moves and the switch is closed thus terminating the F-port. Alternative means for switching between terminated and unterminated signals may also be employed such as toggle mechanisms, rotation mechanisms, etc.

Preferably, the connector is screwed into an aluminum die-cast tap housing as illustrated in FIG. 1 after which the pcb board is mounted from the opposite side of the connector and the connections are soldered onto the pcb.

In the field, installation is simple since it is only necessary to move the actuator pin by removing the mating connector to terminate the signals. The invention thus provides a device for use in distribution equipment which comprises a tap (splitter) housing which includes an F-port comprising an actuator pin mechanism that will automatically switch between terminated and unterminated.

In one preferred embodiment of the invention, the connector comprises a resistor mounted on a printed circuit board with two pins completing the electrical connection of the connector to the pcb and wherein at least one of the pins is spring loaded to assure good contact.

In another preferred embodiment of the invention, the connector comprises a resistor mounted in the connector housing with one or more pins extending from the connector to contact the pcb. In this case, the grounding is made inside the connector and includes spring loading (in the form of a spring or contact formed so as to provide a spring like effect) or to assure good grounding. In this embodiment also the actuator pin is preferably made of a material that will not degrade the electrical performance of the connector and is preferably formed of a plastic material.

SWITCHABLE AND AUTOMATIC TERMINATION CONNECTOR

In an especially preferred embodiment of the invention, the switching mechanism and the automatic termination mechanism described above are combined in a single construction. The tap housing containing the F-port may be installed in a CATV system to selectively supply telephone service to customers who subscribe to telephone service; and to provide only television service to customers who subscribe only to cable service. It permits the service provider to install a single connector whenever it installs cable television services and to subsequently add telephone service from outside the location of the services by rotation of the connector to connect and turn on the power required to operate the telephone to provide telephone services, and to automatically terminate the respective services when the service is not active.

In general, in accordance with the invention, there is provided an electrical connector for making electrical connections between first electrical signal providing means and first electrical signal receiving means and alternatively between second electrical signal and power providing means and second electrical signal and power receiving means, and combinations thereof, said connector containing an inner resilient conductor member connectable to an electrical circuit when contacting circuit-providing means contained in the housing, such as a printed circuit board (pcb), switching means operatively associated with the inner resilient conductor member and the circuit-providing means for selectively opening or closing an electrical connection between either the said first means or the said second means and the said combinations thereof when the inner resilient conductor member contacts the circuit-providing means; and means for terminating the signals when said inner resilient conductor member is not in contact with the circuit-providing means.

In preferred embodiments of the invention, the electrical connecting device is for use as an F-port in a cable television ("CATV") system which includes making electrical connections between first electrical signal providing means and first electrical signal receiving means to provide services including the provision of video and specifically, television, and alternatively between second electrical signal and power providing means and second electrical signal and power receiving means to provide services including telephone services, and combinations thereof, said connector containing the switching means comprising an inner resilient conductor member as described above for selectively making or breaking the electrical connection between the said first means and a pcb and between the said second means and the pcb and combinations thereof; and means for terminating the signals when said inner resilient conductor member is not in contact with the pcb.

In especially preferred embodiments of the invention, the electrical connecting device will include an F-port connector for use in CATV distribution equipment which includes means for making electrical connections between first RF electrical signal providing means and first RF electrical signal receiving means to provide CATV services, and alternatively between second RF electrical signal and power providing means and second RF electrical signal and power receiving means to provide telephone services, and combinations thereof, said connector containing an inner resilient conductor member connectable to an electrical circuit when contacting a pcb contained in the housing; switching means operatively associated with the inner resilient conductor member and the pab for selectively opening or closing an electrical connection between either the said first means or the said second means and the said combinations thereof when the inner resilient conductor member contacts the pcb;

wherein the inner resilient conductor member comprises: an electropin formed at its inlet end with a first pair of push pieces between which the internal conductor of a coaxial cable is connectable and retainable, an actuator pin portion which extends from the first pair of push pieces to a second pair of push pieces and a third pair of push pieces, and a capacitor arranged between the second and third pair of push pieces;

wherein the switching means selectively switch the actuator pin to contact (a) the first and second pairs of push pieces, the capacitor and the pcb as a first mode; and (b) the first and third pairs of push pieces with the capacitor out of the circuit as the second mode or the connections and modes may be reversed. connecting device which comprises means for selectively making electrical connections between either first electrical signal providing means and first electrical signal receiving means and second electrical signal and power providing means and second electrical signal and power receiving means, and combinations thereof, and means for automatically terminating unused signals therein;

wherein the inner resilient conductor member also comprises at least one an actuator pin portion which extends from the first pair of push pieces, and a resistor; and wherein the signals are automatically terminated when said actuator pin is not in contact with said resistor.

The connecting device of this embodiment of the invention may be formed by combining the various aspects of the invention as described hereinabove into a single device which comprises a F-port connector having a housing which comprises, a first electrical half-connector or receptacle intended to provide signals and or power, and a second electrical half-connector or plug intended to receive power when mated with the receptacle and establishing connection between the components of the electrical circuit, wherein the receptacle and plug assembly is preferably rotatable to switch between at least two inputs, and most preferably by separating , for example, by pulling, the outer or external half-connector and rotating it and subsequently again placing the half-connectors in mating position for example, by reinserting the external half-connector in mating relationship with the internal half-connector. The connecting device also comprises a blocking capacitor and a resistor mounted either inside the connector or on a printed circuit board contained in the tap housing. A plunger or actuator pin in the connector and the resistor cooperate so that when the connector is screwed on, the plunger pushes the resistor, the circuit is opened, and the signal flows. If the connector is unscrewed, the actuator pin moves out automatically terminating the signal.

In other alternative embodiments, the connector may be of a single piece construction or the half-connectors may be two or more separate parts that separate or are caused to separate to effect switching between modes and to automatically terminate the undesired signals.

The connecting device of the invention may be formed from materials well known in the art. For example, to avoid corrosion in the rotating area of the connector, suitable materials for the connector are nickel/zinc alloy with yellow chromate containing about 6–10% alkaline-type Ni. Also, to ensure water-tightness, it is preferred to use an "o" ring between the inner and outer shells of the conductor. When employed, the "o" ring is installed in a groove and gently presses against the inner and outer shells providing a water tight seal.

It will be understood that the electrical connector may be of various and differing shapes in addition to that illustrated and described for ease of discussion above and still provide the advantages of the invention.

It will also be understood that the invention contemplates structures where the connector is a single connector or an internal half-connector and external half-connector or combinations thereof or structures where internal and external half-connectors are employed where the internal half-connector is the receptacle or socket and where the external half-connector is the plug as described and illustrated herein, as well as structures where the relationship is reversed.

DETAILED DESCRIPTION OF PREFERRED EMBODIMENTS

F-type end connectors and ports, and/or systems with a single switchable connecting device or with a single automatically terminating connecting device, or with one or more switchable connecting devices combined with one or more automatically terminating devices and any other combination thereof may be considered as part of the context or environment of this invention, or to the extent recited in the appended claims may be elements of the inventive combination.

Figure 1:
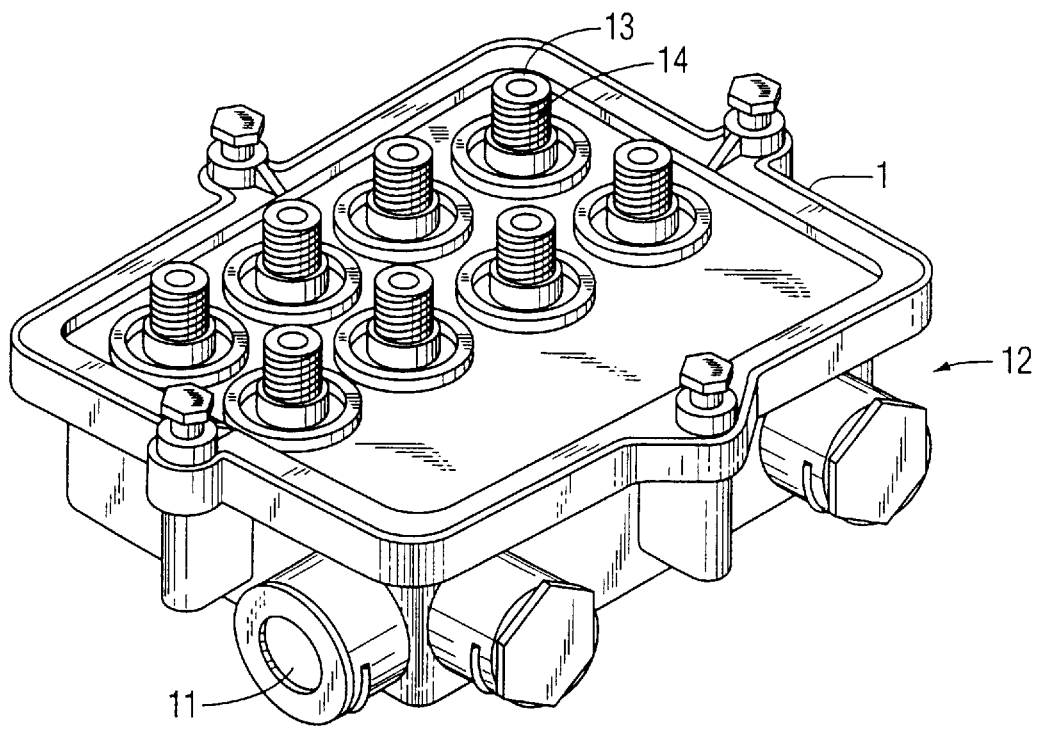
FIG. 1 is an illustration of a tap unit.
Figure 2:
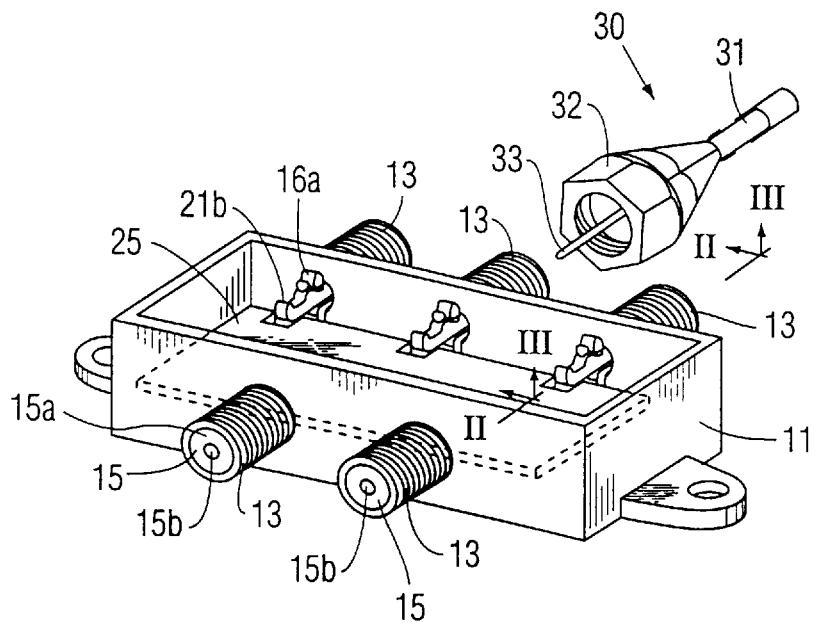
FIG. 2 is a perspective view of distribution equipment provided with a connector of the invention.
Figure 3:
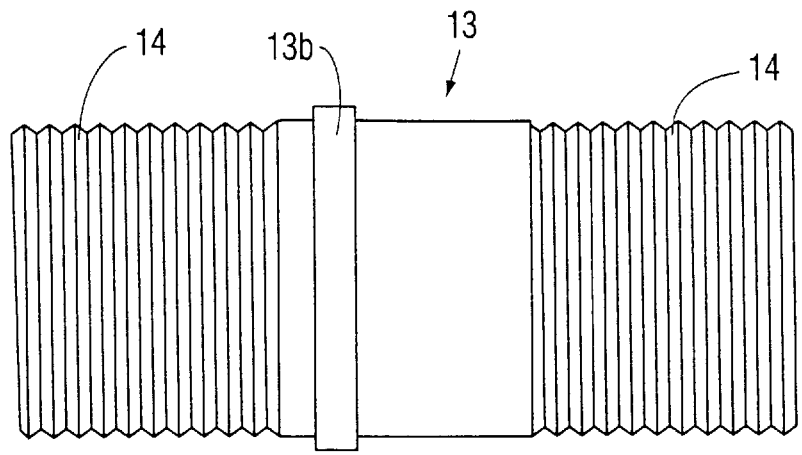
FIG. 3 is a perspective view of a connecting device of the invention.
Figure 4:
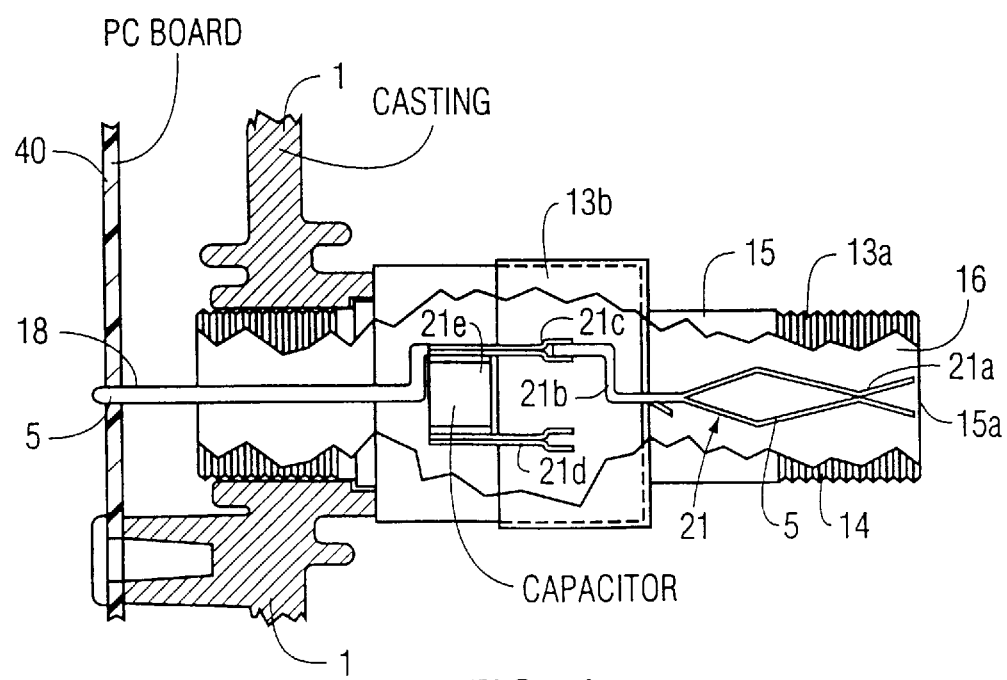
FIG. 4 is a sectional view of a switchable connecting device of the invention taken along lines 2—2 of FIG. 3.
Figure 5:
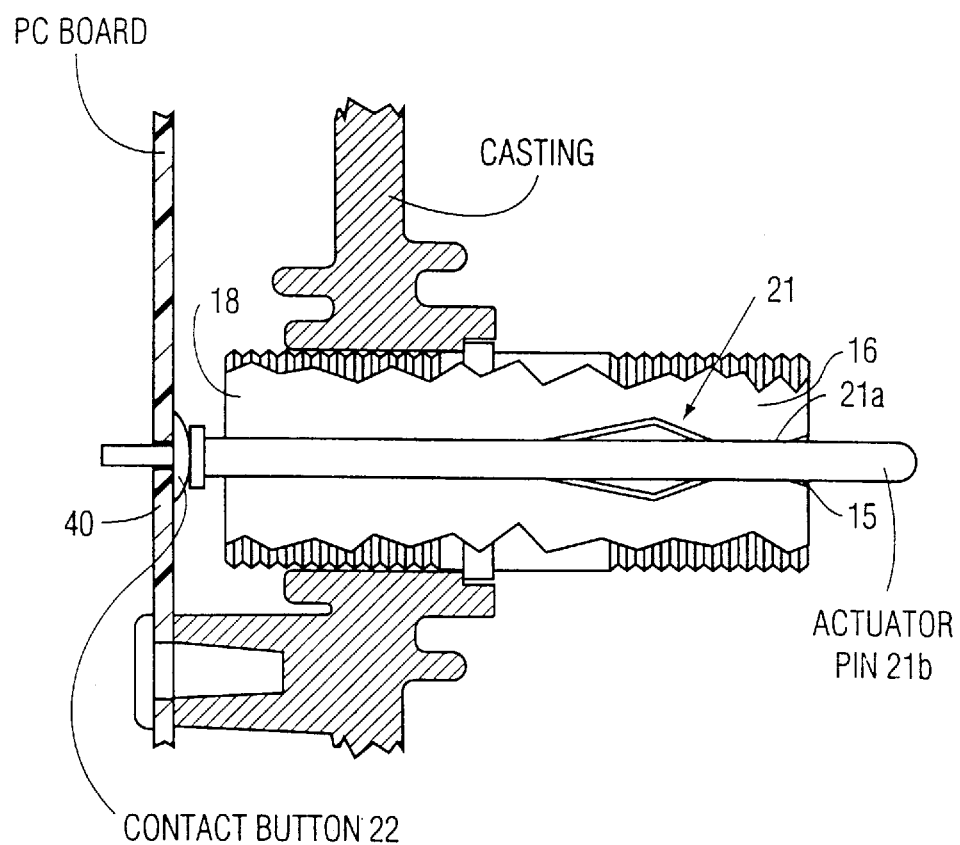
FIG. 5 is a sectional view similar to that of FIG. 4 illustrating a second embodiment of a switchable connecting device of the invention.

With reference to FIGS. 1 and 2, there is illustrated a typical outdoor tap or distribution equipment having a housing or casing 1, a output 11 and an input 12. An outer cylindrical F-port connector 13 with threaded zones 14 formed on its outer periphery to which an outer braid conductor 31 of a coaxial cable 30 is connectable through a nut 32 fixed to a wall surface of the housing 1. The outer braid conductor 31 functions as a grounding conductor, which is inserted conductively in a nut 32. Referring now to FIGS. 3 to 5, the port connector 13 comprises an outer conductor 13a. While the outer conductor 13a is formed integrally with the housing 1 in the example, it can be formed from a member other than the housing and then fixed to the housing 1. The outer conductor 13a also includes a rotatable portion 13b at its central portion. The outer conductor 13a has an inlet end 16 (and into which the internal conductor of the coaxial cable is inserted) and a distal or mounting side to the housing 1 so that the insulator 15 can be inserted easily for assembly. A substantially hollow cylindrical insulator 15 comprising a plastic tube 15a inserted and retained to come in contact with the inner wall surface of the outer conductor 13a and holding an inner resilient conductive member 21 at the central portion is inserted and so retained in the outer conductor 13a of the F-port connector 13.

The inner resilient conductive member 21 comprises an electropin 5 which is formed at its inlet end with a pair of push pieces 21a between which the internal conductor 33 of the coaxial cable 30 is inserted and so retained, an actuator pin 21b which extends from the push pieces 21a to two pairs of push pieces 21c and 21d, and a capacitor 21e situated between the pair of push pieces 21c and 21d. Preferably, the two pairs of push pieces 21c and 21d are preferably set equidistant from the center and approximately 180° from each other. At the distal end 18, the electropin 5 is connected to a pc board shown diagrammatically at 40.

Figure 8:
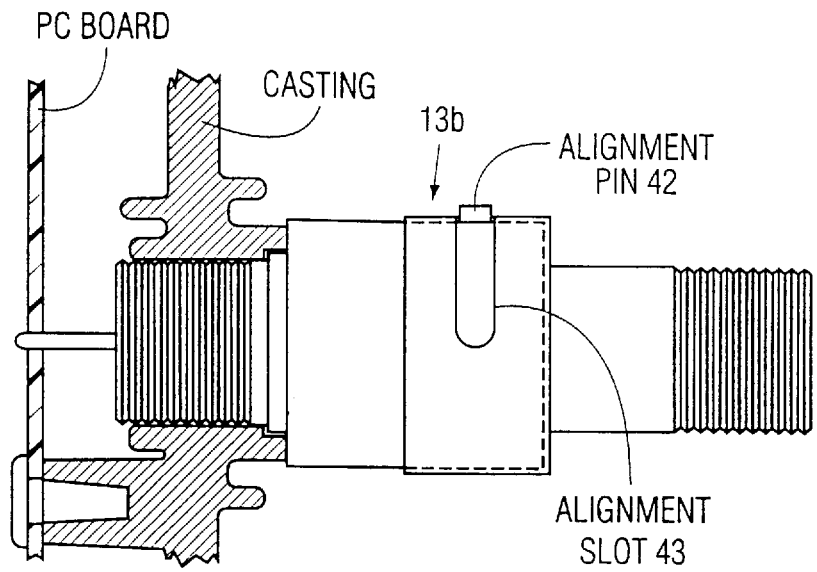
FIG. 8 is a perspective view of a switchable and self-terminating connecting device of the invention having a rotatable portion.

Upon assembly of the connector for connection to distribution equipment, the internal conductor 33 of the coaxial cable is inserted through the hole 15b of the F-port connector 13 between the paired push pieces 21a of the inner resilient conductive member 21. The actuator pin 21b is inserted between the paired push pieces 21c which are operatively associated with the capacitor 21e so that when the actuator pin 21b is in contact therewith, the circuit is opened, and both the signal and power flow. When it is desired to switch the connector to a different mode, for example where only the RF signal is provided, the connector is rotated via rotatable piece 13b causing movement of the actuator pin 21b from the push pieces 21c and insertion thereof in the push pieces 21d. In this position, the capacitor 21e blocks operation of the distribution equipment in the first mode. To switch the connector back to the first mode, it is only necessary to rotate the rotatable piece 13b to remove the actuator pin from the push pieces 21d and to insert the actuator pin into the push pieces 21c. One means for effecting rotation of the rotatable piece 13b may be as illustrated in FIG. 8 wherein an alignment pin 42 is pushed in to release the actuator pin from the respective push piece, the rotatable piece is rotated to move the pin 21 in the alignment slot 43 and is fixed in the other push piece upon release of the alignment pin.

With reference to FIGS. 3 and 5, in an alternative embodiment of the invention, the switch is mounted on the pc board and is normally in the open position to supply only RF signals to the F-port. To supply both RF and power, an actuator pin 21b is installed into the end 15 of the F-port through push pieces 21a of resilient member 21 and at its distal end 18, contacts contact button 22 and thus activates a switch on the pc board. Alternatively, there may be a plurality of contact buttons on the pc board with one or more actuator pins completing the circuit or circuits being switchable into and out of contact depending on the service that is to be provided.

Figure 6:
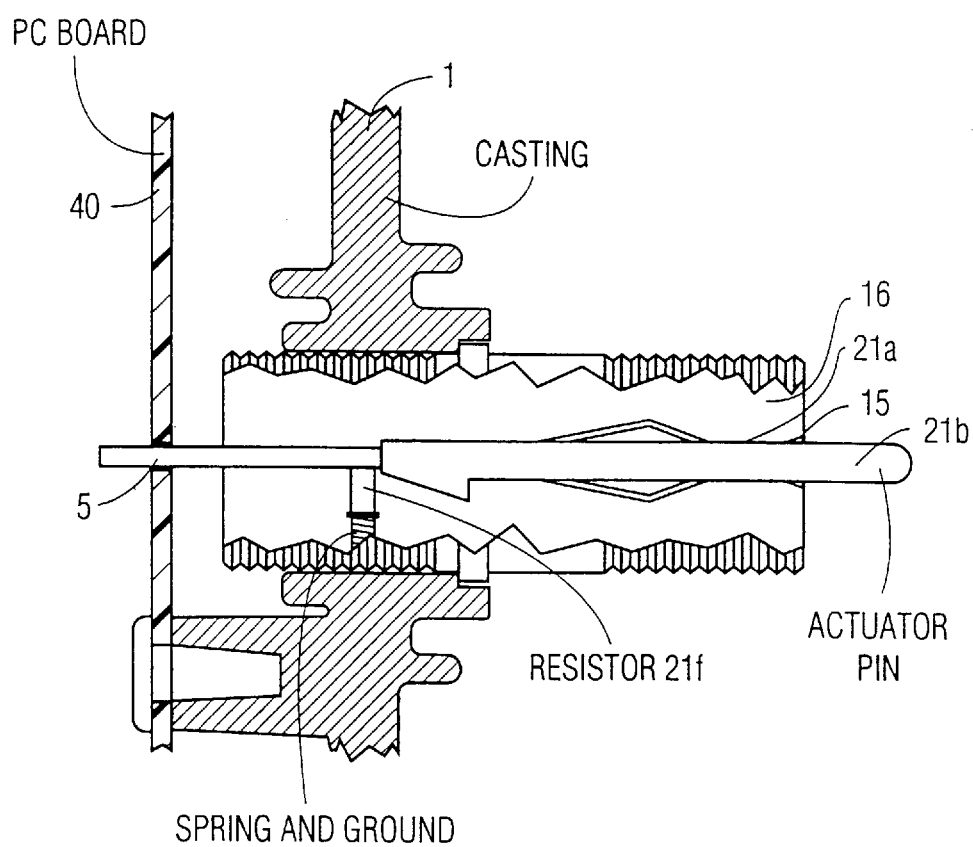
FIG. 6 is a sectional view similar to that of FIG. 4 illustrating an automatically terminating connecting device of the invention.
Figure 7:
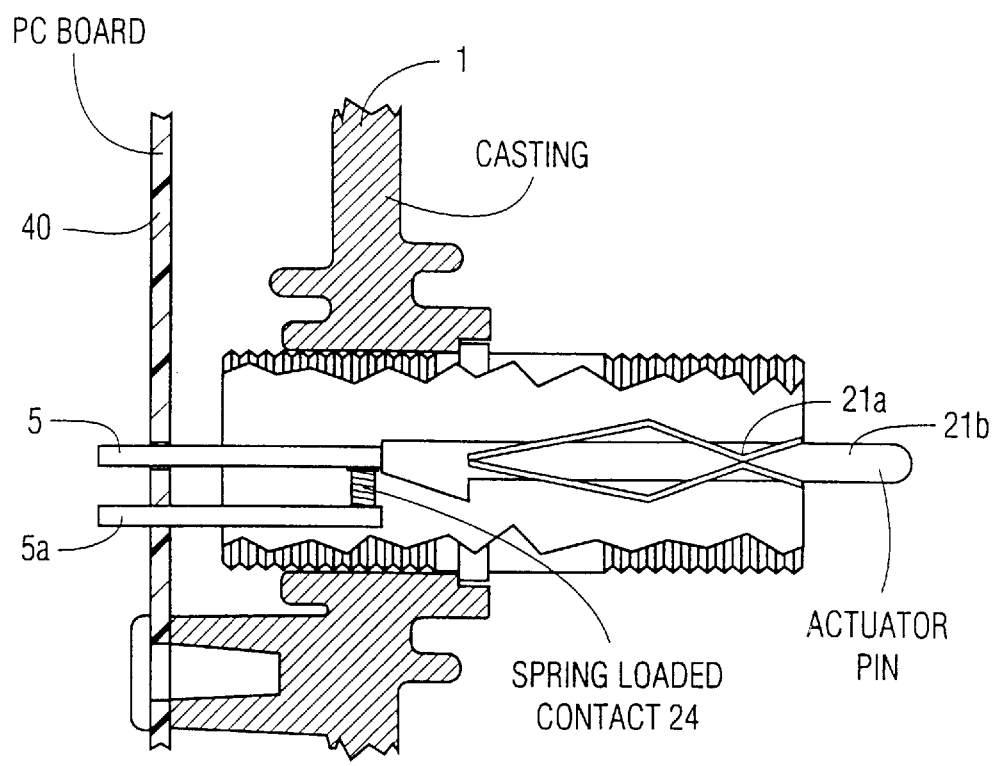
FIG. 7 is a sectional view similar to that of FIG. 6 illustrating a second embodiment of an automatically terminating connecting device of the invention.

Similarly, with reference to FIGS. 3, 6 and 7, there is illustrated an outer cylindrical F-port connector 13 with threaded zones 14 formed on its outer periphery to which an outer braid conductor 31 of a coaxial cable 30 is connectable through a nut 32 fixed to a wall surface of the tap housing 1 as discussed above. The port connector 13 comprises an outer conductor 13a which may be formed integrally with the housing 1 as in the example, or it can be formed from a member other than the housing and then fixed to the housing 1. The outer conductor 13a may also include a rotatable portion 13b at its central portion although this construction is optional and is not mandatory. The interior of the outer conductor 13a is preferably formed with its inner diameter gradually increasing toward an inlet end 16 (and into which the internal conductor of the coaxial cable is inserted) from a mounting side to the housing 1 so that the insulator 15 can be inserted easily for assembly. A substantially hollow cylindrical insulator 15 comprising a plastic tube 15a inserted and retained to come in contact with the inner wall surface of the outer conductor 13a and holding an inner resilient conductive member 21 at the central portion is inserted and so retained in the outer conductor 13a of the F-port connector 13.

The inner resilient conductive member 21 comprises an electropin 5 which is formed at its inlet end with a pair of push pieces 21a between which the internal conductor 33 of the coaxial cable 30 is inserted and so retained, an actuator pin 21b which extends from the push pieces 21a, and a resistor 21f which is spring loaded and making contact to ground and to a RF line. At the distal end 18 of the conductor 13, the electropin 5 is connected to a pc board shown diagrammatically at 40.

Upon assembly of the connector for connection to distribution equipment, the internal conductor 33 of the coaxial cable is inserted through the hole 15b of the F-port connector 13 between the paired push pieces 21a of the inner resilient conductive member 21 to contact the actuator pin 21b. The paired push pieces 21a are operatively associated with the resistor 21f and a membrane switch is present on the pc board. This switch is normally closed. When the F-port connector on a customer's cable is screwed onto the F-port connector 13 of the invention, the actuator pin 21b thus contacts the switch, opens it and thus disconnects the resistor removing the termination. Because the actuator pin 21b is spring loaded, when the connector is removed, the pin 21b will be removed and the switch will close thus automatically terminating the F-port.

In the alternative embodiment shown in FIG. 7, the resistor is mounted on the pc board and a plurality of electropins 5 and 5a, with a spring loaded contact 24 situated between them, are employed to complete the circuit or circuits being switchable into and out of contact depending on the service that is to be provided.

Figure 9:
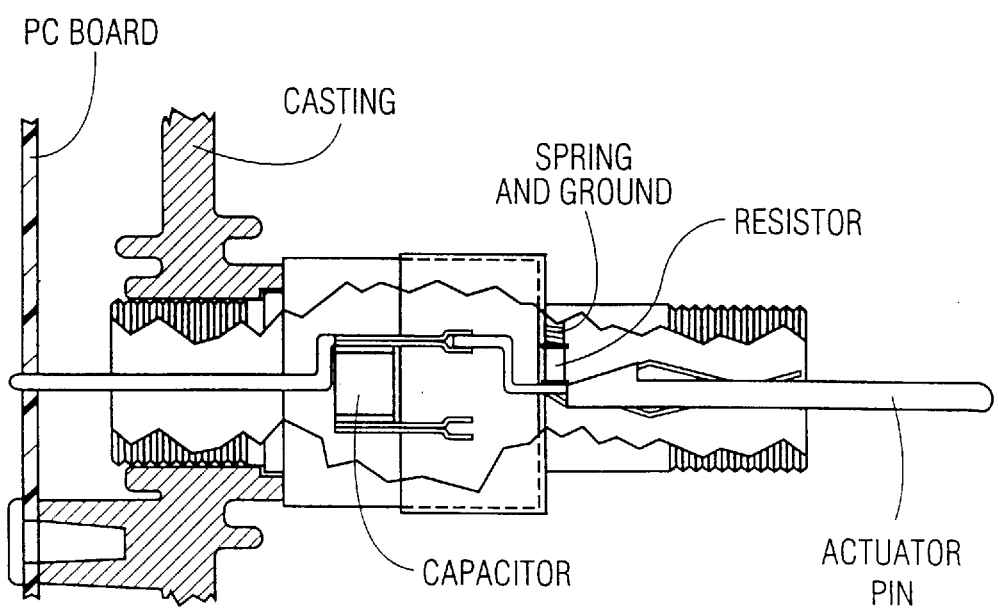
FIG. 9 is a sectional view of a switchable and automatically terminated connecting device of the invention taken along line 9—9 of FIG. 8.

With reference to FIGS. 8 and 9, there is illustrated an embodiment of the invention which combines the various aspects of the invention as described hereinabove into a single device in which the F-port connector 13 comprises a first electrical half-connector or receptacle intended to provide signals and or power, and a second electrical half-connector or plug intended to receive power when mated with the receptacle and establishing connection between the components of the electrical circuit, wherein the receptacle and plug assembly is preferably rotatable via alignment pin 42 in alignment slot 43 to switch between at least two inputs, and most preferably by separating , for example, by pulling, the outer or external half-connector and rotating it and subsequently again placing the half-connectors in mating position for example, by reinserting the external half-connector in mating relationship with the internal half-connector. A blocking capacitor and a resistor are mounted either inside the connector or on a printed circuit board contained in the tap housing 1. The actuator pin in the connector and the resistor cooperate so that when the connector is screwed on, the plunger or actuator pin pushes the resistor, the circuit is opened, and the signal flows. If the connector is unscrewed, the actuator pin moves out automatically terminating the signal. The blocking capacitor mounted inside the connector functions as described above to make or break the circuit as desired when switching between the desired modes.

It will be understood that the connecting device of the invention need not and should not be limited to use as an F-port connector for coaxial television cables and is suitable for connecting wires of different types of devices together when it is desired to provide for automatic termination of signals or for switching between various circuits.

It will also be understood that the invention contemplates structures where the connector is a single connector or an internal half-connector and external half-connector or combinations thereof or structures where internal and external half-connectors are employed where the internal half-connector is a receptacle or socket and where the external half-connector is a plug, as well as structures where the relationship is reversed.

The invention may be embodied in other specific forms without departing from the spirit and scope or essential characteristics thereof, the present disclosed examples being only preferred embodiments thereof.

We claim:

1. An electrical connector for automatically terminating signals in distribution equipment which comprises:

a cylindrical outer conductor for attachment to a housing of the distribution equipment which contains circuit-providing means, a conductor of a coaxial cable being connectable to said outer conductor;

an inner resilient conductor member contained in said outer conductor and connectable to an electrical circuit when contacting said circuit-providing means, a coaxial cable being connectable to said inner resilient conductor member;

and signal terminating means operatively associated with said resilient conductor member and said circuit-providing means whereby an electrical circuit is selectively opened and closed when said inner resilient conductor member has contact with said circuit-providing means, wherein the inner resilient conductor member comprises an electropin comprising push pieces between which the conductor of the coaxial cable is connectable and retainable, and an actuator pin portion for contacting the circuit-providing means.

2. A connector as claimed in claim 1, wherein an insulator is inserted in said outer conductor.

3. A connector as claimed in claim 2, wherein the inner resilient conductor member is inserted in said insulator.

4. A connector as claimed in claim 1 wherein said circuit-providing means is a printed circuit board.

5. A connector as claimed in claim 4 wherein said signal terminating means is attached to the printed circuit board.

6. A connector as claimed in claim 4, wherein said signal terminating means is contained in said resilient inner conductor member inserted inside the outer conductor.

7. A connector as claimed in claim 6, wherein the inner resilient conductor member comprises: an electropin having an inlet end comprising a first pair of push pieces between which the internal conductor of the coaxial cable is connectable and retainable, an actuator pin portion which extends from the pair of push pieces, and a resistor; and wherein the signals are automatically terminated when said actuator pin is not in contact with said resistor.

8. A connector as claimed in claim 7, wherein the outer conductor includes a rotatable portion which is rotated to terminate the signals.

9. An F-port connector for automatically terminating signals in distribution equipment which comprises:

a cylindrical outer ground conductor, having a rotatable portion, for attachment to a housing of the distribution equipment which has a pcb attached thereto, a conductor of a coaxial cable being connectable to said outer ground conductor;

a cylindrical insulator inserted in said outer conductor;

an inner resilient RF signal conductor member contained in said insulator and connectable to an RF signal electrical circuit when a portion thereof is in contact with the pcb, a coaxial cable being connectable to said inner RF signal resilient conductor member;

and means for terminating signals included in said resilient inner conductor operatively associated with said resilient conductor member and said pcb whereby an electrical circuit is selectively opened and closed when said inner resilient conductor member has contact with the pcb, wherein the inner resilient RF signal conductor member comprises: an electropin having an inlet end comprising a pair of push pieces between which the internal RF signal conductor of the coaxial cable is connectable and retainable, an actuator pin portion which extends from the pair of push pieces to contact the pcb, and a resistor; and wherein the signals are automatically terminated when said actuator pin is not in contact with said resistor.

10. A connector for use as an F-port for automatically terminating signals in a cable television system which includes making electrical connections between first electrical signal providing means and first electrical signal receiving means to provide services including the provision of television services, and alternatively between second electrical signal and power providing means and second electrical signal and power receiving means to provide services including telephone services, and combinations thereof, said connector being attached to a tap housing that includes a pcb and said connector containing an inner resilient conductor member connectable to an electrical circuit when contacting the pcb contained in the housing;

signal terminating means comprising a resistor operatively associated with the inner resilient conductor member and the pcb for selectively opening or closing an electrical connection between either the said first means or the said second means when the inner resilient conductor member contacts the pcb.

11. An F-port connector for automatically terminating signals for use in CATV distribution equipment which includes means for making electrical connections between first RF electrical signal providing means and first RF electrical signal receiving means to provide CATV services, and alternatively between second RF electrical signal and power providing means and second RF electrical signal and power receiving means to provide telephone services, and combinations thereof, said connector containing an inner RF signal resilient conductor member connectable to an RF signal electrical circuit when contacting a pcb contained in the housing; signal terminating means comprising a resistor operatively associated with the inner RF signal resilient conductor member and the pcb for selectively opening or closing an electrical connection between either the said first means or the said second means and the said combinations thereof when the inner RF signal resilient conductor member contacts the pcb, wherein the inner RF signal resilient conductor member comprises: at least one electropin having an inlet end comprising a pair of push pieces between which the internal RF signal conductor of the coaxial cable is connectable and retainable, an actuator pin portion which extends from the pair of push pieces to contact the pcb, and the resistor; and wherein the signals are automatically terminated when said actuator pin is not in contact with said resistor.

12. A connector as claimed in claim 11, wherein the resistor is mounted either inside the connector or on the pcb.

13. A connector as claimed in claim 12, wherein said connector includes a first electrical half-connector or receptacle effective to provide signals and or power, and a second electrical half-connector or plug effective to receive power when mated with the receptacle and establishing connection between the components of the electrical circuit.

14. A connector as claimed in claim 13, wherein the receptacle and plug assembly is rotatable to switch between at least two inputs.

15. A connector as claimed in claim 14, wherein a plurality of wires connected by a switch and exiting the connector are soldered to a pcb in the tap housing or in the connector.

16. A connector as claimed in claim 14, wherein the connector includes a single wire which exits the connector and is soldered to a pcb in the tap housing or in the connector.

* * * * *